US009529019B2

(12) United States Patent
Uemura

(10) Patent No.: US 9,529,019 B2
(45) Date of Patent: Dec. 27, 2016

(54) IMPEDANCE DETECTOR FOR OXYGEN CONCENTRATION SENSOR ELEMENT

(71) Applicant: DENSO CORPORATION, Kariya, Aichi-pref. (JP)

(72) Inventor: Shinya Uemura, Obu (JP)

(73) Assignee: DENSO CORPORATION, Kariya (JP)

( * ) Notice: Subject to any disclaimer, the term of this patent is extended or adjusted under 35 U.S.C. 154(b) by 8 days.

(21) Appl. No.: 14/608,248

(22) Filed: Jan. 29, 2015

(65) Prior Publication Data

US 2015/0219694 A1 Aug. 6, 2015

(30) Foreign Application Priority Data

Feb. 5, 2014 (JP) .................................. 2014-20322

(51) Int. Cl.
G01R 17/00 (2006.01)
G01R 27/02 (2006.01)
G01R 27/08 (2006.01)
(52) U.S. Cl.
CPC .............. *G01R 17/00* (2013.01); *G01R 27/02* (2013.01); *G01R 27/08* (2013.01)
(58) Field of Classification Search
None
See application file for complete search history.

(56) References Cited

U.S. PATENT DOCUMENTS 5,547,552 A * 8/1996 Hasegawa .......... G01N 27/4065
204/401
5,781,878 A * 7/1998 Mizoguchi ......... G01N 27/4175
701/109
6,084,418 A * 7/2000 Takami ............... F02D 41/1494
204/424

(Continued)

FOREIGN PATENT DOCUMENTS

JP 2000-081414 A 3/2000
JP 2002-005882 A 1/2002

OTHER PUBLICATIONS

Information Offer Form submitted to the Japanese Patent Office on Dec. 2, 2015 in the corresponding JP application No. 2014-20322. (English translation for relevant part only attached.).

*Primary Examiner* — Jermele M Hollington
*Assistant Examiner* — Suresh K Rajaputra
(74) *Attorney, Agent, or Firm* — Posz Law Group, PLC

(57) ABSTRACT

An impedance detector includes a current application portion, a detection portion, a calculation portion and a changing portion. The current application portion applies an impedance detection current for detecting an impedance of an element of an oxygen sensor to the element. The detection portion detects a difference between a current application prior voltage and a current application subsequent voltage of the element. The calculation portion calculates the impedance of the element based on the difference detected by the detection portion and a value of the impedance detection current applied by the current application portion. The (Continued)

current application portion can change the value of the impedance detection current applied to the element. The changing portion determines to change the value of the impedance detection current according to the difference detected by the detection portion.

6 Claims, 4 Drawing Sheets

(56) References Cited

U.S. PATENT DOCUMENTS

| | | | | |
|---|---|---|---|---|
| 6,094,975 A * | 8/2000 | Hasegawa | ........... | F02D 41/1494 |
| | | | | 123/688 |
| 6,120,677 A * | 9/2000 | Yamada | ............. | F02D 41/1494 |
| | | | | 204/408 |
| 6,205,989 B1 * | 3/2001 | Aoki | ................... | F02D 41/1455 |
| | | | | 123/688 |
| 6,347,544 B1 * | 2/2002 | Hada | .................. | F02D 41/1495 |
| | | | | 123/693 |
| 6,468,478 B1 * | 10/2002 | Honda | ............... | G01N 27/4175 |
| | | | | 324/717 |
| 7,017,567 B2 * | 3/2006 | Hosoya | .............. | G01N 27/4067 |
| | | | | 123/697 |
| 7,393,441 B2 * | 7/2008 | Tashiro | .............. | G01N 27/4065 |
| | | | | 204/406 |
| 7,608,176 B2 * | 10/2009 | Niwa | .................... | G01N 27/419 |
| | | | | 204/406 |
| 8,257,578 B2 * | 9/2012 | Teramoto | ........... | G01N 27/4067 |
| | | | | 204/401 |
| 8,377,275 B2 * | 2/2013 | Ieda | ..................... | G01N 27/407 |
| | | | | 204/426 |
| 8,623,186 B2 * | 1/2014 | Kato | .................. | G01N 27/4067 |
| | | | | 204/424 |
| 2001/0000956 A1 * | 5/2001 | Honda | ................. | G01N 27/4067 |
| | | | | 338/34 |
| 2008/0277281 A1 * | 11/2008 | Hiraiwa | .............. | G01N 27/4067 |
| | | | | 204/406 |
| 2010/0122568 A1 * | 5/2010 | Inoue | .................... | G01N 27/419 |
| | | | | 73/31.05 |
| 2014/0278013 A1 * | 9/2014 | Gibson | .................. | G01R 27/02 |
| | | | | 701/108 |

* cited by examiner

IMPEDANCE DETECTOR FOR OXYGEN CONCENTRATION SENSOR ELEMENT

CROSS REFERENCE TO RELATED APPLICATION

This application is based on Japanese Patent Application No. 2014-20322 filed on Feb. 5, 2014, the disclosure of which is incorporated herein by reference.

TECHNICAL FIELD

The present disclosure relates to an impedance detector for detecting an impedance of an element of an oxygen concentration sensor.

BACKGROUND

For example, JP 10-48180 A, which corresponds to U.S. Pat. No. 6,120,677, describes a technology for detecting the impedance of an element (element impedance) of an oxygen concentration sensor that is used for controlling an air fuel ratio of an internal combustion engine. In the technology of JP 10-48180 A, a cell as the element is applied with a constant current for measuring an impedance, that is, for measuring a resistance value. A difference between a both-end voltage of the element before being applied with the constant current and a both-end voltage of the element after being applied with the constant current is detected as a value that is correlated with the impedance of the element.

SUMMARY

In the technology of JP 10-48180 A, the value of the current applied to the element is a known quantity, and the impedance can be obtained by dividing the difference detected by the value of the current applied to the element for measuring the impedance. When the value of the current for measuring the impedance is set to a large value, the difference has a large value. Thus, accuracy of detecting the impedance improves. However, when the current having a large value is applied to the element in a case where the element has a large impedance, the element is applied with a large voltage between both of the ends thereof. Therefore, there is a possibility that the element is damaged.

It is an object of the present disclosure to provide an impedance detector for detecting an impedance of an element of an oxygen concentration sensor, which is capable of reducing damage to the element and improving detection accuracy.

According to an aspect of the present disclosure, an impedance detector for detecting an impedance of an element of an oxygen concentration sensor includes a current application portion, a detection portion, a calculation portion, and a changing portion. The current application portion applies an impedance detection current for detecting an impedance of the element to the element. The detection portion detects a difference between a current application prior voltage and a current application subsequent voltage. The current application prior voltage is a voltage between both ends of the element before the element is applied with the impedance detection current. The current application subsequent voltage is a voltage between both of the ends of the element when the element is being applied with the impedance detection current. The calculation portion calculates the impedance of the element based on the difference detected by the detection portion and a value of the impedance detection current applied to the element by the current application portion. The current application portion can change the value of the impedance detection current applied to the element. The changing portion determines to change the value of the impedance detection current that the current application portion applies to the element according to the difference detected by the detection portion.

In such a structure, the difference detected by the changing portion is proportional to the impedance of the element. Therefore, damage to the element is reduced as well as accuracy of detection of the impedance is improved by changing the value of the impedance detection current applied to the element according to the difference. That is, it is less likely that the element will be damaged due to the impedance detection current being too large when the impedance of the element is large. Also, it is less likely that the accuracy of detection of the impedance will be degraded due to the impedance detection current being too small when the impedance of the element is small.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Embodiments of the present disclosure will be hereinafter described.

In the embodiments, a control device is employed to a fuel injection control system that performs a feedback control of an air fuel ratio of an internal combustion engine of a vehicle, that is, controls the amount of fuel injection so as to have a target air fuel ratio. Hereinafter, it is mainly described about a structure and a processing for detecting an impedance of an element of an oxygen concentration sensor that is used for detecting an actual air fuel ratio in the fuel injection control system.

First Embodiment

Figure 1:
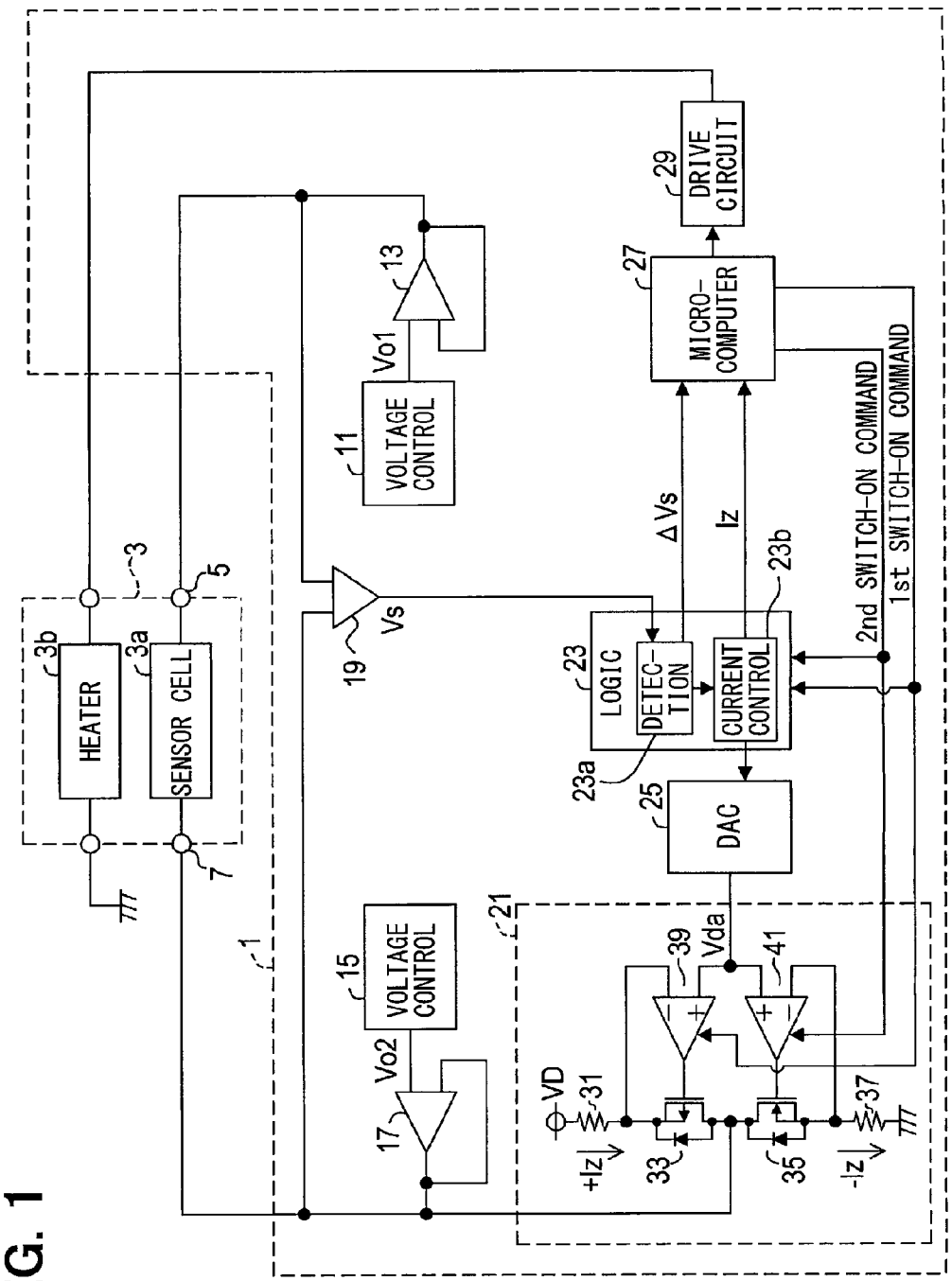
FIG. 1 is a schematic block diagram illustrating a structure of a control device for an impedance detector according to a first embodiment of the present disclosure.

As shown in FIG. 1, an air fuel ratio sensor 3 for detecting an air fuel ratio is connected to a control device 1 of a first embodiment.

The air fuel ratio sensor 3 is a limiting current-type one cell air fuel ratio sensor. The air fuel ratio sensor 3 is installed in an exhaust passage of the engine of the vehicle. The air fuel ratio sensor 3 includes a sensor cell 3a and a heater 3b. The sensor cell 3a generates a limiting current according to an air fuel ratio of an exhaust gas in a state of being applied with voltage. The heater 3b is provided to heat the sensor cell 3a. The limiting current generated by the sensor cell 3a is a sensor current according to the air fuel ratio detected by the air fuel ratio sensor 3. In this example, the sensor cell 3a corresponds to an element that is an object to detect impedance.

The sensor cell 3a has a first terminal 5 and a second terminal 7. For example, the first terminal 5 is a positive-side terminal, and the second terminal 7 is a negative-side terminal. The control device 1 includes a voltage control part 11 and a buffer circuit 13 for applying a voltage to the first terminal 5 of the sensor cell 3a. The control device 1 also includes a voltage control part 15 and a buffer circuit 17 for applying a voltage to the second terminal 7 of the sensor cell 3a.

The buffer circuit 13 is provided by an operational amplifier. The buffer circuit 13 outputs a voltage that has the same value as an output voltage Vo1 of the voltage control part 11 to the first terminal 5 of the sensor cell 3a. The buffer circuit 17 is provided by an operational amplifier. The buffer circuit 17 outputs a voltage that has the same value as an output voltage Vo1 of the voltage control part 15 to the second terminal 7 of the sensor cell 3a.

For example, when the output voltage Vo1 of the voltage control part 11 is 2.9 V and the output voltage Vo2 of the voltage control part 15 is 2.5 V, the sensor cell 3a is applied with a voltage of 0.4 V. The output voltages Vo1 and Vo2 of the voltage control parts 11 and 15 are different from each other. In this case, one of or both of the output voltages Vo1 and Vo2 may be a fixed value or may be changed according to the sensor current. In other words, the voltage applied to the sensor cell 3a may have a fixed value or may be changed according to the sensor current.

The control device 1 further includes an amplification circuit 19, a current application circuit 21, a logic part 23, a D/A converter (digital-to-analog converter, DAC) 25, a microcomputer 27, and a drive circuit 29. The amplification circuit 19 amplifies and outputs a both-end voltage Vs of the sensor cell 3a, which is a voltage between both of the ends of the sensor cell 3a and will be also referred to as the sensor-across voltage Vs. The current application circuit 21 applies a current for detecting an impedance Z of the sensor cell 3a to the sensor cell 3a. The drive circuit 29 turns on electricity to the heater 3b according to an instruction from the microcomputer 27.

The amplification degree of the amplification circuit 19 is arbitrary. In this case, it is defined as that the amplification degree of the amplification circuit 19 is one (amplification degree=1), so as to simplify the explanation. That is, the explanation will be given in the example where the voltage having the same value as the sensor-across voltage Vs is outputted from the amplification circuit 19.

In the current application circuit 21, a resistor 31, a first switch 33, a second switch 35, and a resistor 37 are orderly connected in series, between a constant power supply voltage VD and a ground line. A connection point between the first switch 33 and the second switch 35 is connected to the second terminal 7 of the sensor cell 3a. In this example, the first switch 33 and the second switch 35 are provided by MOSFETs. Alternatively, the first switch 33 and the second switch 35 may be switching elements of any other type, such as a bipolar transistor and an insulated gate bipolar transistor (IGBT)

The current application circuit 21 includes a first operational amplifier 39 and a second operational amplifier 41.

The first operational amplifier 39 receives a voltage of a connection point between the resistor 31 and the first switch 33, and an output voltage Vda of the D/A converter 25. When the first operational amplifier 39 receives a first switch-on command from the microcomputer 27, the first operational amplifier 39 turns on the first switch 33 so that the voltage at the connection point between the resistor 31 and the first switch 33 coincides with the output voltage Vda of the D/A converter 25. When the first operational amplifier 39 does not receive the first switch-on command from the microcomputer 27, the first operational amplifier 39 turns off the first switch 33. The first switch-on command outputted from the microcomputer 27 is, for example, a high-active signal.

The second operational amplifier 41 receives a voltage of a connection point between the resistor 37 and the second switch 35, and the output voltage Vda of the D/A converter 25. When the second operational amplifier 41 receives a second switch-on command from the microcomputer 27, the operational amplifier 41 turns on the second switch 35 so that the voltage at the connection point between the resistor 37 and the second switch 35 coincides with the output voltage Vda of the D/A converter 25. When the second operational amplifier 41 does not receive the second switch-on command from the microcomputer 27, the second operational amplifier 41 turns off the second switch 35. The second switch-on command outputted from the microcomputer 27 is also a high-active signal, for example.

A resistance value of the resistor 31 is referred to as a resistance value R31. A resistance value of the resistor 37 is referred to as a resistance value R37.

In the current application circuit 21, when the first switch-on command is outputted from the microcomputer 27 and the first witch 33 is turned on, a current expressed by "(VD−Vda)/R31" is applied to the sensor cell 3a in a direction from the second terminal 7 to the first terminal 5. Hereinafter, this current, that is, the current applied to the sensor cell 3a due to the first switch 33 being turned on is referred to as the "current +Iz". When the second switch-on command is outputted from the microcomputer 27 and the second switch 35 is turned on, a current expressed by "Vda/R37" is applied to the sensor cell 3a in a direction from the first terminal 5 to the second terminal 7. Hereinafter, this current, that is, the current applied to the sensor cell 3a due to the second switch 35 being turned on is referred to as the "current −Iz".

The D/A converter 25 outputs a voltage, which is indicated by digital data provided from the logic part 23, to the first operational amplifier 39 and the second operational amplifier 41.

The logic part 23 includes a detection portion 23a and a current control portion 23b. The logic part 23 is provided by a logic circuit or a microcomputer different from the microcomputer 27, for example. The logic part 23 receives the sensor-across voltage Vs outputted from the amplification circuit 19 and the first and second switch-on commands from the microcomputer 27.

The current control portion 23b outputs digital data to the D/A converter 25 so that the current +Iz when the first switch-on command indicates a high level (i.e., when the first switch 33 is turned on) and the current −Iz when the second switch-on command indicates a high level (i.e., when the second switch 35 is turned on) have the same current value. In the present embodiment, the current +Iz and the current −Iz are constant currents having the same absolute value but directions thereof are different. Hereinafter, the absolute value (current value) of the currents +Iz and −Iz will be referred to as an application current value Iz. In regard to the directions of the current (application current) applied to the sensor cell 3a, when the direction of the current +Iz is defined as a positive direction, the current +Iz is a positive application current, and the current −Iz is a negative application current. In the present embodiment, the current +Iz is an impedance detection current for detecting an impedance Z of the sensor cell 3a.

The current control portion 23b changes the application current value Iz in plural ways, e.g., to plural levels by changing the value of the digital data provided to the D/A converter 25. For example, the current control portion 23b may switch the application current value Iz between two levels, such as 100 μA and 1 mA. As another example, the current control portion 23b may switch the application current value Iz between three levels, such as 100 μA, 500 μA and 1 mA. The number of switching levels of the application current value Iz, that is, the number of ways of switching the application current value Iz may be suitably determined. Operations of the detection portion 23a and the current control portion 23b will be described later more in detail.

Figure 2:
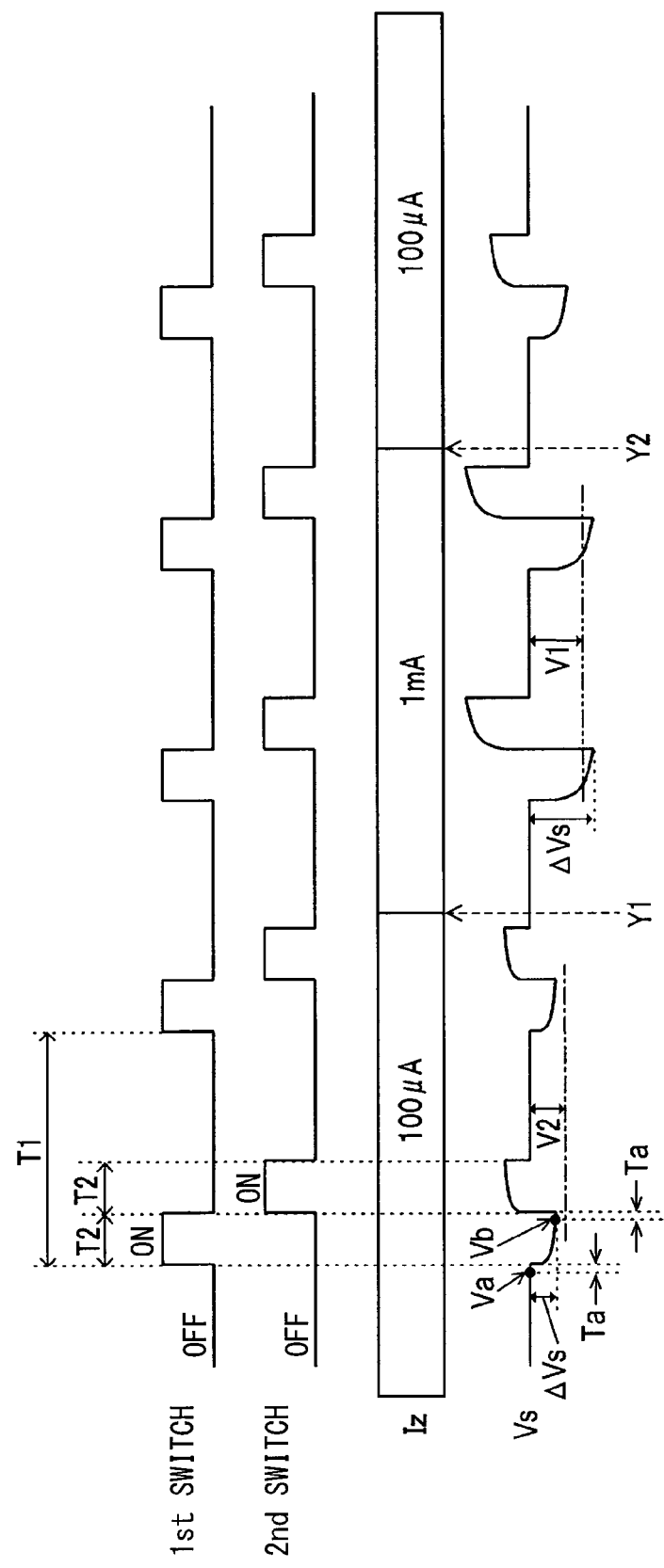
FIG. 2 is a diagram for explaining an operation of the control device according to the first embodiment.

As shown in the first and second top waveforms of FIG. 2, the microcomputer 27 turns on the first switch 33 only for a predetermined time period T2 in every constant time period T1. In particular, the first switch-on command is made to the high level only for the predetermined time period T2. Further, the microcomputer 27 turns on the second switch 35 only for the predetermined time period T2 after the first switch 33 is turned off from the on state. In particular, the second switch-on command is made to the high level only for the predetermined time period T2 after the first switch-on command is returned to the low level from the high level.

Therefore, in every constant time period T1, the current application circuit 21 applies the current +Iz to the sensor cell 3a, and applies the current −Iz, which has the same value but is in the opposite direction, to the sensor cell 3a immediately after the completion of the application of the current +Iz. The constant time period T1 is a period for detecting the impedance Z of the sensor cell 3a. The constant time period T1 is longer than twice of the predetermined time period T2, as shown in FIG. 2.

As shown in the fourth waveform of FIG. 2, the sensor-across voltage Vs varies according to the application of the currents +Iz and −Iz to the sensor cell 3a. In FIG. 2, the sensor-across voltage Vs is indicated as the voltage of the first terminal 5 relative to the voltage of the second terminal 7 as a reference. Therefore, the sensor-across voltage Vs reduces according to the application of the current +Iz (i.e., turning on the first switch 33) and increases according to the application of the current −Iz (i.e., turning on the second switch 35).

In the logic part 23, the detection portion 23a operates synchronizing with the first switch-on command. The detection portion 23a detects a current application prior voltage Va that is the sensor-across voltage Vs immediately before the current +Iz is applied, and a current application subsequent voltage Vb that is the sensor-across voltage Vs in a period where the current +Iz is being applied. In this example, the current application subsequent voltage Vb is the sensor-across voltage Vs immediately before the application of the current +Iz is ended.

In particular, the detection portion 23a detects the sensor-across voltage Vs at a timing a predetermined time Ta prior to the timing where the first switch-on command changes from the low level to the high level, that is, at a timing the predetermined time Ta prior to the timing the current application circuit 21 begins the application of the current +Iz, as the current application prior voltage Va. The detection portion 23a detects the sensor-across voltage Vs at a timing a predetermined time Ta prior to the timing where the first switch-on command changes from the high level to the low level, that is, at a timing the predetermined time Ta prior to the timing where the current application circuit 21 ends the application of the current +Iz, as the current application subsequent voltage Vb. The predetermined time Ta is sufficiently shorter than the time period T2 in which the first switch 33 is turned on. Therefore, the sensor-across voltage Vs immediately before the application of the current +Iz to the sensor cell 3a is initiated and the sensor-across voltage Vs immediately before the application of the current +Iz to the sensor cell 3a is ended can be detected, respectively, as the current application prior voltage Va and the current application subsequent voltage Vb. It is to be noted that the predetermined time Ta is preferably close to zero as much as possible.

Figure 4:
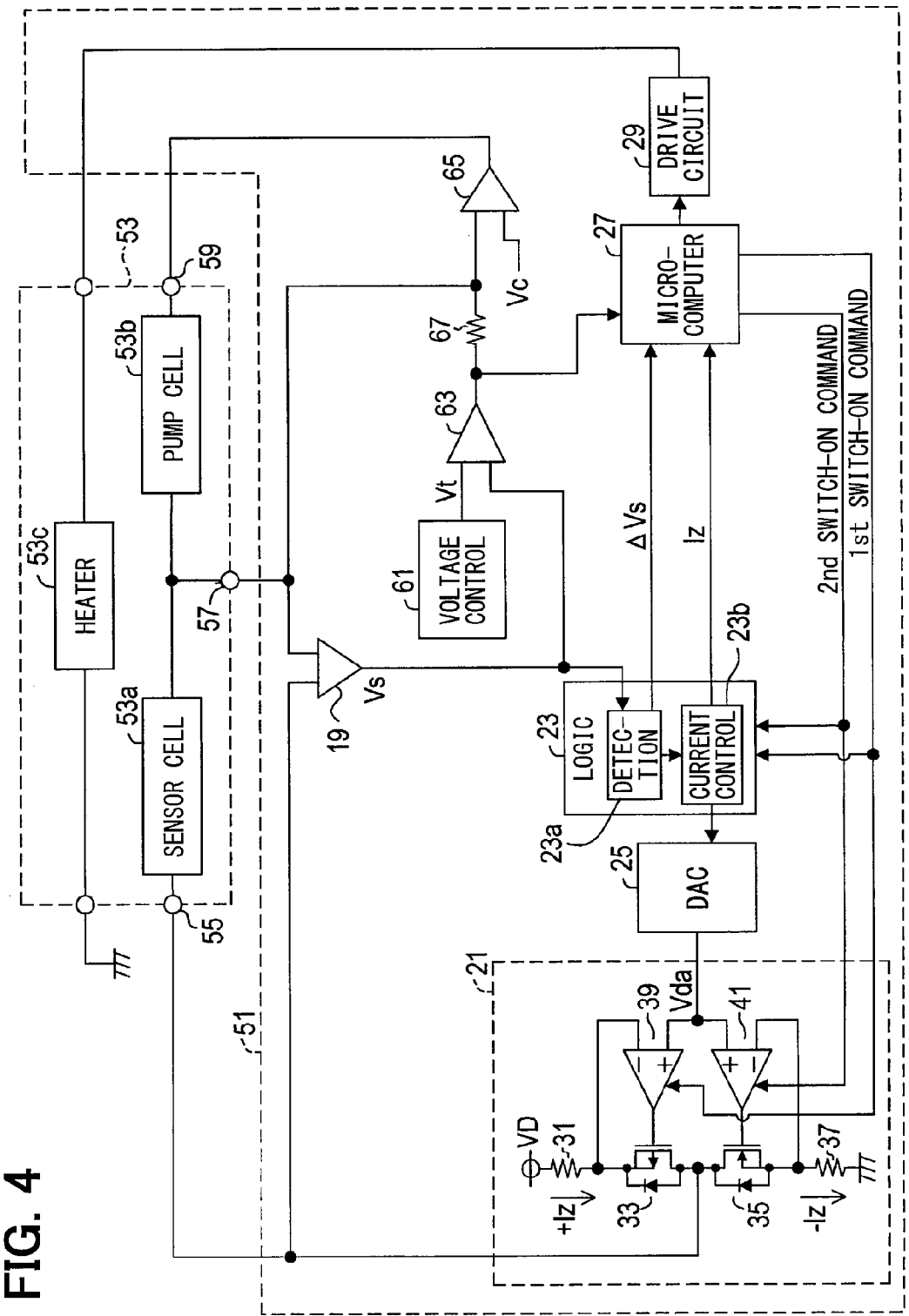
FIG. 4 is a schematic block diagram illustrating a structure of a control device for an impedance detector according to a second embodiment of the present disclosure.

Further, the detection portion 23a calculates a difference ΔVs between the current application prior voltage Va and the current application subsequent voltage Vb, that is, an absolute value of the difference between the current application prior voltage Va and the current application subsequent voltage Vb (see the fourth waveform in FIG. 4). The difference ΔVs is proportional to the impedance Z of the sensor cell 3a and the current +Iz.

The current control portion 23b of the logic part 23 changes the application current value Iz according to the difference ΔVs detected by the detection portion 23a. That is, the current control portion 23b of the logic part 23 changes the digital data outputted to the D/A converter 25 according to the difference ΔVs.

The contents of a processing performed by the current control portion 23b will be described in detail with reference to FIG. 3.

Figure 3:
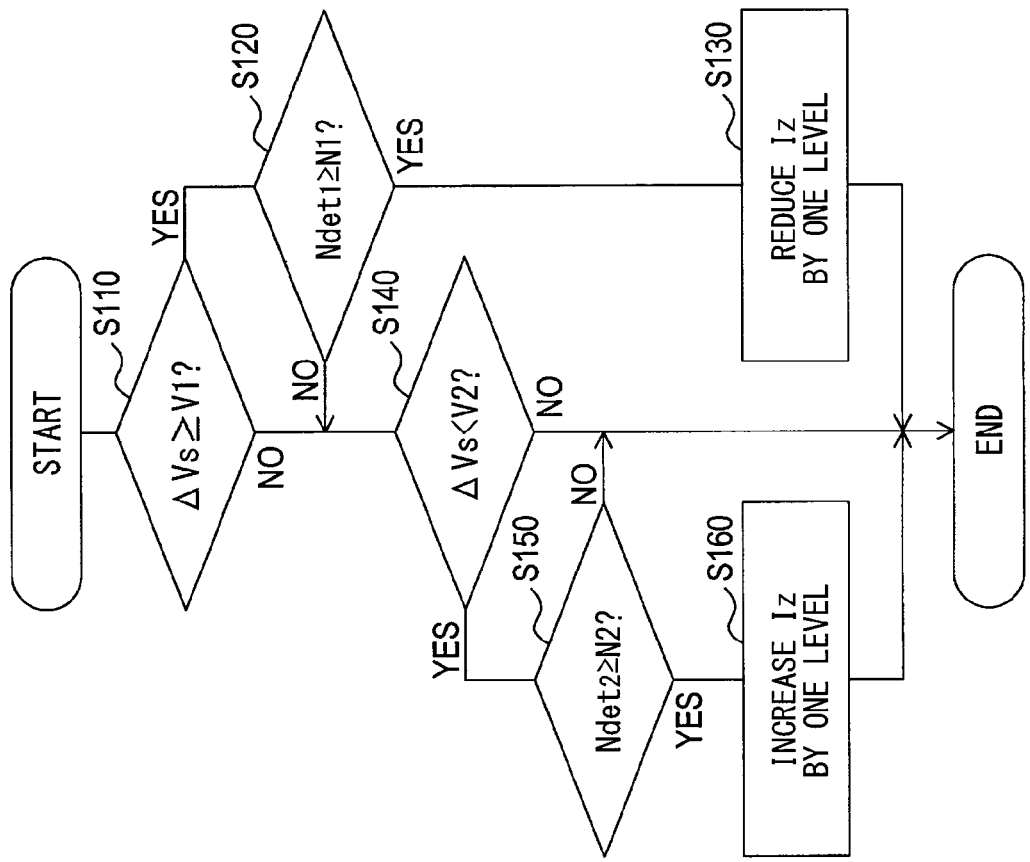
FIG. 3 is a flowchart illustrating a processing performed by a current control portion of the control device according to the first embodiment.

The current control portion 23b performs the processing shown in FIG. 3 every time the detection portion 23a calculates new difference ΔVs.

The current control portion 23b determines whether the difference ΔVs calculated in this time is equal to or greater than a predetermined current reduction determination value V1 (i.e. ΔVs≥V1 ?) (S110). When the current control portion 23b determines that the difference ΔVs is equal to or greater than the current reduction determination value V1 (S110: YES), the current control portion 23b determines whether the number of times $N_{det1}$ that an affirmative determination of the difference ΔVs being equal to or greater than the current reduction determination value V1 is continuously made is equal to or greater than a predetermined number of times N1 (S120). The current reduction determination value V1 is, for example, 1 V. The predetermined number of times N1 is equal to or greater than two.

When the current control portion 23b determines that the number of times $N_{det1}$ that the affirmative determination of the difference ΔVs being equal to or greater than the current reduction determination value V1 is continuously made is equal to or greater than the predetermined number of times N1 (S120: YES), the current control portion 23b changes the application current value Iz for the next time to a value that is one level smaller than the value of the present time, among the plural values (S130).

When the current control portion 23b determines that the difference ΔVs is not equal to or greater than the current reduction determination value V1 at S110 (S110: NO), or when the current control portion 23b determines that the number of times $N_{det1}$ that the affirmative determination of the difference ΔVs being equal to or greater than the current reduction determination value is continuously made is not equal to or greater than the predetermined number of times N1 (S120: NO), the current control portion 23b determines whether the difference ΔVs calculated in this time is less than a predetermined current increase determination value V2 (i.e., ΔVs<V2 ?) (S140).

When the current control portion 23b determines that the difference ΔVs is less than the predetermined current increase determination value V2 (S140: YES), the current control portion 23b further determines whether the number of times $N_{det2}$ that an affirmative determination of the difference ΔVs being less than the predetermined current increase determination value V2 is continuously made is equal to or greater than a predetermined number of times N2 (S150). The current increase determination value V2 is smaller than the current reduction determination value V1, and is, for example, 0.1 V. The predetermined number of times N2 is equal to or greater than two.

When the current control portion 23b determines that the number of times $N_{det2}$ that the affirmative determination of the difference ΔVs being less than the predetermined current increase determination value V2 is continuously made is equal to or greater than the predetermined number of times N2 (S150: YES), the current control portion 23b changes the current application current value Iz for the next time to the one that is one level higher than the application current value of the present time, among the plural values (S160).

When the current control portion 23b determines that the difference ΔVs is not less than the predetermined current increase determination value V2 (S140: NO), or when the current control portion 23b determines that the number of times $N_{det2}$ that the affirmative determination of the difference ΔVs being less than the predetermined current increase determination value V2 is continuously made is not equal to or greater than the predetermined number of times N2 (S150: NO), the current control portion 23b does not change the application current value Iz.

That is, the current control portion 23b reduces the application current value Iz (S130) when it is determined that the difference ΔVs, which is calculated every predetermined time period T1, i.e., at a predetermined interval T1, is equal to or greater than the current reduction determination value V1 continuously for the predetermined number of times N1 or more (S120: YES). The current control portion 23b increases the application current value Iz (S160) when it is determined that the difference ΔVs, which is calculated every predetermined time period T1, i.e., at the predetermined interval T1, is lower than the current increase determination value V2 continuously for the predetermined number of times N2 or more (S150: YES).

The logic part 23 outputs the difference ΔVs detected by the detection portion 23a and the present application current value Iz set by the current control portion 23b to the microcomputer 27.

The microcomputer 27 calculates the impedance Z of the sensor cell 3a based on the difference ΔVs and the application current value Iz. In particular, the microcomputer 27 calculates the impedance Z by dividing the difference ΔVs by the application current value Iz (i.e., Z=ΔVs/Iz).

The impedance Z of the sensor cell 3a has a correlation with the temperature of the sensor cell 3a. For this reason, the microcomputer 27 determines whether the sensor cell 3a is in an active state, or controls turning on or off of the electricity to the heater 3b based on the calculated impedance Z.

Although not illustrated in FIG. 1, a current detection resistor for detecting current is disposed on a path through which the sensor current according to the air fuel ratio flows. For example, the current detection resistor is disposed on a current path between the output terminal of the buffer circuit 13 and the first terminal 5 of the sensor cell 3a, or on a current path between the output terminal of the buffer circuit 17 and the second terminal 7 of the sensor cell 3a.

The both-end voltage of the current detection resistor, that is, the voltage between both of the ends of the current detection resistor is inputted to the microcomputer 27. The microcomputer 27 detects the sensor current based on the both-end voltage of the current detection resistor inputted thereto. Further, the microcomputer 27 converts the detected sensor current into the air fuel ratio by applying the detected sensor current to a predetermined formula or data map.

The air fuel ratio detected in this manner is used for an air fuel ratio feedback control of the internal combustion engine. The processing for detecting the sensor current or the processing for converting the sensor current into the air fuel ratio may be performed by a microcomputer or the like different from the microcomputer 27.

Next, an operation of the control device 1 will be described with reference to FIG. 2. Hereinafter, an example in which the predetermined numbers of times N1 and N2 are both two, and the application current value Iz is switched between two levels, such as 100 μA and 1 mA will be described.

As shown in FIG. 2, when the difference ΔVs, which is detected every constant time period T1, i.e., at a predetermined interval T1 by the detection portion 23a, is less than the current increase determination value V2 continuously for two times, the application current value Iz is changed from 100 μA to 1 mA, which is one level higher than 100 μA. (See arrow Y1 in FIG. 2.) Thereafter, when the difference ΔVs, which is detected every constant time period T1, i.e., at the predetermined interval T1 by the detection portion 23a, is equal to or greater than the current reduction determination value V1 continuously for two times, the application current value Iz is changed from 1 mA to 100 μA, which is one level lower than 1 mA. (See arrow Y2 in FIG. 2.)

Although not illustrated, for example, in a case where the application current value Iz is changed among three levels, such as 100 μA, 500 μA and 1 mA, the current application value Iz is changed as in a manner of 100 μA→500 μA→1 mA, every time the difference ΔVs is less than current increase determination value V2 continuously for the number of times N2. Further, the application current value Iz is changed as in a manner of 1 mA→500 μA→100 μA every time the difference ΔVs is equal to or greater than the current reduction determination value V1 continuously for the number of times N1.

As described above, the control device 1 changes the application current value Iz according to the difference ΔVs. Namely, the control device 1 changes the impedance detection current applied to the sensor cell 3a (the current +Iz in the example described above) according to the difference ΔVs. Therefore, damage to the sensor cell 3a is reduced, and the impedance Z is accurately detected. Namely, it is less likely that the sensor cell 3a will be damaged due to the application current value Iz being too large when the impedance Z is large. Also, it is less likely that the detection accuracy of the impedance Z will be degraded due to the application current value Iz being too small when the impedance Z is small.

In particular, the current control portion 23b reduces the application current value Iz when it is determined that the difference ΔVs is equal to or greater than the current reduction determination value V1. Therefore, it is less likely that the sensor cell 3a will be damaged due to the application current value Iz being too large when the impedance Z is large. Further, the current control portion 23b increases the application current value Iz when it is determined that the difference ΔVs is less than the current increase determination value V2. Therefore, it is less likely that the detection accuracy of the impedance Z will be degraded due to the application current value Iz being too small when the impedance Z is small.

The current reduction determination value V1 and the current increase determination value V2 may be the same value. In the present embodiment, however, the current reduction determination value V1 is greater than the current increase determination value V2. Therefore, it can be properly determined whether to increase or reduce the application current value Iz. As such, the change of the application current value Iz, that is, the increase or reduction of the application current value Iz can be properly performed.

The current control portion 23b reduces the application current value Iz when it is determined that the difference ΔVs is equal to or greater than the current reduction determination value V1 continuously for the predetermined number of times N1 or more. The current control portion 23b increases the application current value Iz when it is determined that the difference ΔVs is less than the current increase determination value V2 continuously for the predetermined number of times N2 or more. As such, chattering during the transition of the state can be reduced.

After applying the current +Iz to the sensor cell 3a, the control device 1 applies the current −Iz, which has the same absolute value as that of the current +Iz but is different in direction from the current +Iz. Therefore, the time period that the sensor cell 3a returns to a normal state that performs the output according to the air fuel ratio (e.g., to the state of generating the sensor current according to the air fuel ratio in this example) after the application of the current +Iz can be shortened.

As a modification, the oxygen concentration sensor as the object to detect the impedance Z may be an oxygen sensor ($O_2$ sensor) an output voltage of which rapidly changes at a predetermined air fuel ratio (in general, a theoretical air fuel ratio), which is also referred to as a lambda sensor. In the case of the $O_2$ sensor, the voltage control parts 11 and 15 and the buffer circuits 13 and 17 of FIG. 1 can be eliminated. The air fuel ratio sensor 3 or the $O_2$ sensor may be a sensor without having the heater 3b or a sensor to which the heater 3b is separately provided.

Second Embodiment

Next, a control device according to the second embodiment will be described. Structural elements similar to those of the first embodiment are designated with the same reference numbers as those of the first embodiment, and thus detailed descriptions thereof will not be repeated.

A control device 51 of the second embodiment shown in FIG. 4 is different from the control device 1 of the first embodiment on the following points (1) to (3).

(1) An air fuel ratio sensor 53 connected to the control device 51 is a two-cell air fuel ratio sensor having two cells. The air fuel ratio sensor 53 includes a sensor cell 53a that is an electromotive force cell, a pump cell 53b and a heater 53c. In the air fuel ratio sensor 53, the pump cell 53b is operated such that an output voltage of the sensor cell 53a is constant. The current flowing in the pump cell 53b when the pump cell 53b is operated such that the output voltage of the sensor cell 53a is constant is measured as the sensor current indicating the air fuel ratio. Similarly to the first embodiment, the heater 53c heats the censor cell 53a and the pump cell 53b when being turned on by the drive circuit 29 of the control device 51.

(2) The sensor cell 53a of the air fuel ratio sensor 53 is an element as an object to detect the impedance. For this reason, the connection point between the first switch 33 and the second switch 35 of the current application circuit 21 is connected to one terminal 55 of the sensor cell 53a. Another terminal 57 of the sensor cell 53a is a common terminal with the pump cell 53b. The amplification circuit 19 outputs the both-end voltage of the sensor cell 53a, that is, the voltage between the terminal 55 and the terminal 57 as the sensor-across voltage Vs.

In this example, the terminal 55 is a positive-side terminal of the sensor cell 53a, and the terminal 57 is a negative-side terminal of the sensor cell 53a and the pump cell 53b. A terminal 59 of the pump cell 53b is a positive-side terminal of the pump cell 53b.

(3) The control device 51 includes a voltage control part 61, operational amplifiers 63 and 65 and a current detection resistor 67, in place of the voltage control parts 11 and 15 and the buffer circuits 13 and 17.

The voltage control part 61 outputs a target voltage Vt (e.g., 0.45 V) of the sensor-across voltage Vs. The operational amplifier 63 is applied with the target voltage Vt from the voltage control part 61 and the sensor-across voltage Vs from the amplification circuit 19. An output terminal of the operational amplifier 63 is connected to the terminal 57 through a current detection resistor 67. The operational amplifier 63 changes the output voltage so that the sensor-across voltage Vs coincides with the target voltage Vt. The operation amplifier 65 is applied with the voltage of the terminal 57 and a constant voltage Vc (e.g., 4 V). An output terminal of the operational amplifier 65 is connected to the terminal 59. The operational amplifier 65 outputs the voltage to the terminal 59 so that the voltage of the terminal 57 coincides with the voltage Vc.

In such a structure, a pump cell current, that is, a current applied to the pump cell 53b is adjusted so that the sensor-across voltage Vs that is the output voltage of the sensor cell 53a coincides with the target voltage Vt. The pump cell current flows in the current detection resistor 67 as the sensor current indicating the air fuel ratio.

For this reason, the microcomputer 27 detects the sensor current based on the both-end voltage of the current detection resistor 67, and converts the sensor current detected into the air fuel ratio by applying the sensor current detected to a predetermined formula or data map. The voltage at one end of the current detection resistor 67 is same as the voltage at the terminal 57, and is thus kept at the known voltage Vc. In the example shown in FIG. 4, therefore, the voltage of the end of the current detection resistor 67 adjacent to the operational amplifier 63 is inputted to the microcomputer 27 as a monitoring voltage for detecting the sensor current.

The microcomputer 27 performs an analog-to-digital conversion (A/D conversion) of the monitoring voltage, and subtracts the value of the voltage Vc from the result of the A/D conversion, thereby to detect the both-end voltage of the current detection resistor 67. As another example, the microcomputer 27 may be configured to receive the voltage of each of the ends of the current detection resistor 67.

In the control device 51 of the second embodiment, the structure and the processing for detecting the impedance Z of the sensor cell 53a are similar to those of the control device 1 of the first embodiment. Therefore, also in the control device 51 of the second embodiment, the effects similar to the effects of the control device 1 of the first embodiment are achieved.

The embodiments of the present disclosure are described hereinabove. However, the present disclosure is not limited to the embodiments described hereinabove, but may be implemented in various other ways. Further, the numeral values described hereinabove are just examples, and may be modified to any other values.

For example, in the control device 1 of the first embodiment, the current −Iz and the current −Iz may be applied to the sensor cell 3a as the oxygen concentration sensor in directions opposite to the above-described directions, so that the current −Iz is used as the current for detecting the impedance.

For example, it may be configured such that only one of the current +Iz and the current −Iz is applied to the sensor cell 3a.

For example, in the processing shown in FIG. 3, the determinations of S120 and S150 may be eliminated. In such a case, when the affirmative determination is made at S110 (S110: YES), the process of S130 is performed. Also, when the affirmative determination is made at S140 (S140: YES), the process of S160 is performed. Further, these are true for the processing of the control device 51 of the second embodiment.

In the embodiments described above, the function of one structural element may be separated into plural structural elements, or the functions of the plural structural elements may be combined into one structural element.

For example, at least a part of the structures of the embodiments described above may be replaced with a known structure having the similar function.

For example, a part of the structure of the embodiments described above may be eliminated as long as the object can be achieved.

For example, a part of the structures of the embodiment described above may be added to another embodiment described above or replaced with the structure of another embodiment described above.

In addition to the control device for detecting the impedance of the element described above, the present disclosure may be implemented in various forms such as a system including the control devices described above as a structural element, a program including instructions to execute the control device by a computer, a non-transitory computer readable storage medium storing the program, a method for detecting the impedance of the element, and the like.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. An impedance detector for detecting an impedance of an element of an oxygen concentration sensor, the impedance detector comprising:
a current application portion applying an impedance detection current for detecting an impedance of the element to the element;
a detection portion detecting a difference between a current application prior voltage and a current application subsequent voltage, the current application prior voltage being a voltage between both ends of the element before the element is applied with the impedance detection current, the current application subsequent voltage being a voltage between both of the ends of the element when the element is applied with the impedance detection current;
a calculation portion calculating the impedance of the element based on the difference detected by the detection portion and a value of the impedance detection current applied to the element by the current application portion; and
a changing portion, wherein
the current application portion is configured to change the value of the impedance detection current applied to the element,
the changing portion determines a change in the value of the impedance detection current that the current application portion applies to the element according to the difference detected by the detection portion, and
when the changing portion determines that the difference is equal to or greater than a predetermined current reduction determination value, the changing portion determines that the change in the value of the impedance detection current is a reduction in the value of the impedance detection current.

2. The impedance detector according to claim 1, wherein when the changing portion determines that the difference is less than a predetermined current increase determination value, the changing portion determines that the change in the value of the impedance detection current is an increase in the value of the impedance detection current.

3. The impedance detector according to claim 2, wherein the predetermined current reduction determination value is greater than the predetermined current increase determination value.

4. The impedance detector according to claim 2, wherein the current application portion is operated at a predetermined interval, and
when the changing portion determines that the difference detected by the detection portion at the predetermined interval is equal to or greater than the current reduction determination value continuously for at least a predetermined number of times, the changing portion determines that the change in the value of the impedance detection current is the reduction in the value of the impedance detection current, and
when the changing portion determines that the difference detected by the detection portion at the predetermined interval is less than the current increase determination value continuously for at least a predetermined number of times, the changing portion determines that the change in the value of the impedance detection current is the increase in the value of the impedance detection current.

5. The impedance detector according to claim 1, wherein the detection portion detects a voltage between both of the ends of the element at a timing a predetermined time prior to an initiation of application of the impedance detection current to the element by the current application portion as the current application prior voltage, and
the detection portion detects a voltage between both of the ends of the element at a timing a predetermined time prior to a completion of application of the impedance detection current to the element by the current application portion as the current application subsequent voltage.

6. The impedance detector according to claim 1, wherein after applying the impedance detection current to the element, the current application portion applies an impedance detection current having a same value as a previous impedance detection current but being in a direction opposite to the previous impedance detection current.

* * * * *